(12) United States Patent
Takase et al.

(10) Patent No.: US 6,440,519 B1
(45) Date of Patent: Aug. 27, 2002

(54) PHOTOCURABLE ADHESIVE FOR OPTICAL DISK

(75) Inventors: Hideaki Takase, Ibaraki; Ryoji Furuta, Mie; Toshihiko Takahashi, Kanagawa; Takashi Ukachi; Yuichi Takehana, both of Ibaraki, all of (JP)

(73) Assignees: DSM N.V., Heerlen (NL); JSR Corporation; Japan Fine Coatings Co., Ltd., both of Tokyo (JP)

( * ) Notice: Subject to any disclaimer, the term of this patent is extended or adjusted under 35 U.S.C. 154(b) by 0 days.

(21) Appl. No.: 09/160,546

(22) Filed: Sep. 25, 1998

Related U.S. Application Data

(63) Continuation-in-part of application No. PCT/NL98/00089, filed on Feb. 12, 1998.

(30) Foreign Application Priority Data

Feb. 13, 1997 (JP) .............................................. 9-044839
Sep. 26, 1997 (JP) .............................................. 9-279655

(51) Int. Cl.$^7$ ............................ B32B 3/02; B32B 31/00; C09J 4/00; C09J 175/16
(52) U.S. Cl. ................. 428/65.2; 428/64.7; 156/275.5; 156/275.7; 522/96; 522/97; 522/171; 522/172; 522/173
(58) Field of Search ............................ 522/90, 92, 96, 522/97, 171, 172, 173; 428/64.4, 64.7, 65.2; 156/275.7

(56) References Cited

U.S. PATENT DOCUMENTS

| | | | | | |
|---|---|---|---|---|---|
| 3,992,477 | A | * | 11/1976 | Dickie et al. | .................. 522/96 |
| 4,539,382 | A | * | 9/1985 | Omura et al. | .................. 522/96 |
| 5,663,211 | A | * | 9/1997 | Kominami et al. | ............ 522/8 |
| 5,895,697 | A | * | 4/1999 | Tajima et al. | |
| 6,017,603 | A | * | 1/2000 | Tokuda et al. | |

FOREIGN PATENT DOCUMENTS

| | | |
|---|---|---|
| GB | 2 094 329 | 9/1982 |
| JP | 142545 | 6/1986 |
| JP | 63-37034 | 8/1989 |
| JP | 63-176337 | 1/1990 |
| JP | 2-80423 | 3/1990 |
| JP | 89462 | 3/1994 |
| JP | 136977 | 12/1996 |

* cited by examiner

*Primary Examiner*—Susan W. Berman
(74) *Attorney, Agent, or Firm*—Pillsbury Winthrop LLP

(57) ABSTRACT

A photocurable resin composition which comprises (A) a urethane (meth)acrylate oligomer obtained by the reaction of (a) at least one polyol compound preferably selected from the group consisting of polyester polyols and polycarbonate polyols, (b) a polyisocyanate compound, and (c) a hydroxyl group-containing (meth)acrylate compound; (B) a (meth)acrylolylphosphate; (C) a multifunctional (meth)acrylate compound; and (D) a photopolymerization initiator and, optionally, (E) an organosilyl-containing mercapto compound. The composition exhibits a fast cure speed, and the cured products obtained from the composition exhibit superior adhesion under high temperature-high humidity conditions and metal corrosion properties.

19 Claims, No Drawings

PHOTOCURABLE ADHESIVE FOR OPTICAL DISK

This is a Continuation-in-Part of: International Application No. PCT/NL98/00089 filed Feb. 12, 1998 which designated the U.S.

CROSS-REFERENCE TO RELATED APPLICATION

This application is a continuation-in-part of PCT/NL98/00089, filed Feb. 12, 1998, the entire contents of which are hereby incorporated by reference.

FIELD OF THE INVENTION

The present invention relates to a photocurable resin composition and, in particular, to a photocurable resin composition useful as an adhesive for the manufacture of optical disks.

BACKGROUND OF THE INVENTION

In recent years, development of high-density recording media has been pursued in response to the demand for high capacity recording media, accompanied by advances in the quality of information such as letters, voice, picture images, and the like. An optical disk which is called a digital versatile disk (DVD) is one type of optical disk. A DVD can record a greater amount of information than a CD (compact disk), even though these disks are almost the same in size. At present, DVDs are mainly manufactured by a so called bonding method, which comprises forming recording layers on at least one plastic disk by depositing metal using a sputtering technique. The disks are then laminated together with an adhesive to form a mult-layer DVD.

A hot-melt type or a heat hardening type adhesive have been conventionally used in this method. These adhesives, however, have exhibited problems in the length of time required for manufacturing optical disks. These adhesives not only require a long working time to obtain sufficient adhesion characteristics but also experience decreased adhesion under high temperature-high humidity conditions, because these adhesives are easily softened and melted under such conditions. As a result, DVD disks bonded by conventional adhesives have a tendency to become displaced when the optical disks are preserved under high temperature-high humidity conditions after manufacture, which is unacceptable.

To overcome these problems, ultraviolet radiation (UV) curable type adhesives comprising urethane acrylate as a major component have recently been proposed (for example, Japanese Patent Applications Laid-open No. 142545/1986, No. 89462/1994). However, these recently proposed adhesives much like the other conventional adhesives provide unsatisfactory photo-curability and adhesive properties.

In addition, the use of these UV adhesives have resulted in corrosion of the metal used in the recording layer because of moisture attack.

An object of the present invention is to provide a photocurable resin composition possessing superior curability, producing cured products which exhibit excellent adhesive properties under high temperature-high humidity conditions, and which are free from metal corrosion.

SUMMARY OF THE INVENTION

As a result of extensive studies to solve these problems in the conventional techniques, the present inventors have found that these problems can be solved by a specific photocurable resin composition which comprises:

(A) an oligomer comprising a polymeric backbone, linked via urethane bonds to (meth)acrylate terminal groups (hereinafter referred to as a urethane (meth)acrylate (A)), (B) a phosphate containing at least one (meth)acryloyl group (hereinafter referred to as (meth)acryloyl phosphate (B)), (C) a (meth)acrylate compound including multifunctional (meth)acrylate compounds, and optionally, (D) a photopolymerization initiator, and/or (E) organosilyl-containing mercapto compound.

It was found that such compositions provide improved adhesion properties especially to gold layers, a substrate either formed of gold or in part having gold covering at least a portion or portions of the surface (e.g., gold sputtered polycarbonate), even after being exposed to a high humidity, high temperature environment. These adhesive compositions are suitable for use in laminating the multi-layers of optical disks because, upon curing, they have excellent optical transparency, low shrinkage, high temperature resistance, high impact resistance, and exhibit good bonding characteristics to a variety of materials.

DETAILED DESCRIPTION OF THE INVENTION

The composition of the present invention exhibits excellent adhesion to transparent resins including, for example, polycarbonates (PC), methyl polymethacrylates (PMMA), and norbornane-type resins; metals including, for example, gold and aluminum; and inorganic materials such as quartz and glass. Therefore, the composition of the present invention is suitable as an adhesive for use in multi-layered or laminated optical disks.

More specifically, the adhesive of the present invention is useful for laminating together two or more disks to form a multi-layered optical disks. Typically, at least one but commonly each of the disks will contain at least one information recording layer, or portion of a layer, composed of a reflective film, semi-transparent film, dielectric film, photo-electromagnetic recording film, or phase alternation film, made from an inorganic material such as a metal, metal oxide, silicon oxide, silicon nitride, or silicon carbide. Other disks that may be useful include those that may or may not be transparent which may further comprise an information recording film of an organic compound such as an organic coloring material or organic photo-chromic compound. For example, the multi-layered optical disk may be formed from a disk with an information recording layer provided on a transparent resin and another transparent disk by adhering the two disks with the information recording layer on the first disk facing inward. A further example may include a multi-layered optical disk comprising an optical disk made from a disk substrate with an information recording layer provided on a transparent resin disk and another disk with a film of an inorganic or organic material having no recording function provided on a transparent resin, wherein the two disks are laminated together with the recording layer of the first disk facing inward.

The photocurable resin composition of the present invention will now be described in more detail.

Urethane (Meth)acrylate (A)

The urethane (meth)acrylate of component (A) comprises a polymeric backbone, urethane bonds and (meth)acrylate terminal groups. This oligomer containing an urethane bond preferably is obtained by condensation of (a) at least one polymeric polyol compound selected from a group consisting of polyester polyols and polycarbonate polyols, (b) a polyisocyanate compound, and (c) a hydroxyl group-containing (meth)acrylate compound. The polyol compound constitutes the backbone, which is connected to the (meth)acrylate terminal groups through the urethane groups that are formed by reaction of the isocyanates with the hydroxyl groups.

The following compounds can be given as examples of the polyester polyols: polyester polyols obtained by the reaction of a polyhydric alcohol, such as ethylene glycol, polyethylene glycol, propylene glycol, polypropylene glycol, tetramethylene glycol, polytetramethylene glycol, 1,4-butanediol, 1,6-hexanediol, neopentyl glycol, 1,4-cyclohexane-dimethanol, 3-methyl-1,5-pentanediol, 1,9-nonanediol, 2-methyl-1,8-octanediol, or trimethylolpropane, and a dibasic acid, such as phthalic acid, isophthalic acid, terephthalic acid, maleic acid, fumaric acid, adipic acid, or sebasic acid; and polyester polyols obtained by reaction of ε-caprolactone, β-methyl-δ-valerolactone or the like and the above-mentioned polyhydric alcohol. These polyester polyols may be used either individually or in combinations of two or more.

Given as commercially available products of these polyester polyols are Kurapol A-1010, 1510 and 2010, L-1010, 2010 and 3010, F-1010, 2010 and 3010, PNA-2000 and 2010, P-510, 1010, 1510, 2010, 3010 and 4010, PMIPA-2000, PKA-A, PKA-A2, MPD/IPA, MPD/TPA, CPM-1000 (manufactured by Kuraray Co., Ltd.); Nipporan 4002, 4009, 4010, 4032, 4040, 4042, 4060, 4070, 141, 143, 150, 5018, 5019, 5035 (manufactured by Nippon Polyurethane Industry CO., Ltd.); Adeka New Ace F15-20, F7-37, F18-62, F15-22, F7-68, F7-67, Y4-60, F13-35, F9-30, Y9-10, Y6-22, Y52-13, Y52-51, Y52-21, L4-71, V14-90, YG-108, YG-214, F1212-29, YG-226, Y96-20, YG-240, YT-101, YT-650, YT-651, YT-603, YT-400 (manufactured by Asahi Denka Kogyo Co., Ltd.); PLACCEL 205, 205AL, 212, 212AL, 220, 220AL, 303, 305, 308, 312, 320 (manufactured by Daicel Chemical Industries, Ltd.); and TONE 0301, 0305 and 0310 (manufactured by Union Carbide Corp.). Of these, Kurapol A-1010, 1510 and 2010, L-1010 and 2010, P-1010, 1510 and 2010, Adeka New Ace YG-108, YG-226, YG-240 and YG-214 are particularly desirable.

An example of useful polycarbonate polyols include those represented by the following formula (1):

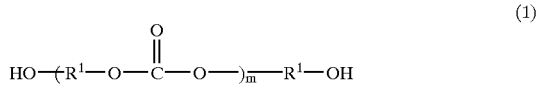

(1)

wherein each $R^1$ independently represents usually an alkylene group having 2–20, preferably 4–15, carbon atoms, or a residual group (excluding the two hydroxyl groups) from (poly)ethylene glycol, (poly)propylene glycol, or (poly)tetramethylene glycol, wherein the plurality of $R^1$'s may be the same or different. And "m" denotes an integer from 1–30, preferably an integer from 3–20.

Given as specific examples of $R^1$ are residual groups, after exclusion of the two hydroxyl groups, from 1,4-butanediol, 3-methyl-1,5-pentanediol, neopentyl glycol, 1,6-hexanediol, 1,4-cyclohexanedimethanol, 1,7-heptanediol, 1,8-octanediol, 1,9-nonanediol, ethylene glycol, diethylene glycol, triethylene glycol, tetraethylene glycol, propylene glycol, dipropylene glycol, tripropylene glycol, and tetrapropylene glycol.

Commercially available products of the polycarbonate diol include Nipporan 980, 981, 982, 983 (manufactured by Nippon Polyurethane Industry Co., Ltd.); PC-8000 (manufactured by PPG Industries, Inc.), PNOC1000, PNOC2000, PMC-100,2000 (manufactured by Kuraray Co., Ltd.); and PLACCEL CD-205, CD-208, CD-210, CD-220, CD-205PL, CD-208PL, CD-210PL, CD-220PL, CD-205HL, CD-208HL, CD-210HL, CD-220HL, CD-210T, CD-221T (manufactured by Daicel Chemical Industries, Ltd.). Of these, PNOC1000, 2000, Nipporan 982, 983, PLACCEL CD-205HL, CD-210HL, and CD-220HL are particularly desirable.

The average number of hydroxy groups in the polyol generally will be between 1.8 and 4, preferable between about 2 and 3. Most preferably, the number of hydroxy groups of the polyol is about 2.

The number average molecular weight of the polyol compounds measured by the terminal group method (OH-number, taking into account the functionality of the polymer polyol) is usually in the range of 200–20,000. To ensure adequate hardness and ease of handling of resulting adhesives, a molecular weight in the range of 300–10,000, particularly 400–5,000, is preferred.

Examples of useful polyisocyanate compounds include diisocyanate compounds such as 2,4-tolylene diisocyanate, 2,6-tolylene diisocyanate, 1,3-xylylene diisocyanate, 1,4-xylylene diisocyanate, 1,5-naphthalene diisocyanate, m-phenylene diisocyanate, p-phenylene diisocyanate, 3,3'-dimethyl-4,4'-diphenylmethane diisocyanate, 4,4'-diphenylmethane diisocyanate, 3,3'-dimethyl phenylene diisocyanate, 4,4'-biphenylene diisocyanate, 1,6-hexane diisocyanate, isophorone diisocyanate, hydrogenated xylene diisocyanate, hydrogenated diphenylmethane diisocyanate, methylenebis (4-cyclohexylisocyanate), 2,2,4-trimethylhexamethylene diisocyanate, 1,4-hexamethylene diisocyanate, and norbornane diisocyanate methyl. Lysine triisocyanate is given as an example of (useful) triisocyanate compound. Among the useful polyisocyanate compounds, 2,4-tolylene diisocyanate, isophorone diisocyanate, hydrogenated xylene diisocyanate, and norbornane diisocyanate methyl are particularly desirable in view of reactivity of isocyanate groups, selectivity, and the characteristics of the resulting oligomers. These polyisocyanate compounds may be used either individually or in combinations of two or more.

The proportion of polyisocyanate compound used should be such that the isocyanate group contained in the polyisocyanate compound is usually 1–4 equivalents, preferably 1.1–3 equivalents, for one equivalent of the hydroxyl group contained in the above-mentioned polyol compound.

Given as examples of the hydroxyl group-containing (meth)acrylate compounds are 2-hydroxyethyl (meth)acrylate, 2-hydroxypropyl (meth)acrylate, 2-hydroxybutyl (meth)acrylate, 4-hydroxybutyl (meth)acrylate, 2-hydroxy-3-phenyloxypropyl (meth)acrylate, 1,4-butanediol mono (meth)acrylate, 2-hydroxy alkyl (meth)acryloyl phosphates (here, alkyl is methyl, ethyl, or propyl, for example), 4-hydroxycyclohexyl (meth)acrylate, 1,6-hexanediol mono (meth)acrylate, neopentyl glycol mono(meth)acrylate, trimethylolpropane di(meth)acrylate, trimethylolethane di(meth)acrylate, pentaerythritol tri(meth)acrylate, dipentaerythritol penta(meth)acrylate; compounds shown by the following formula (2),

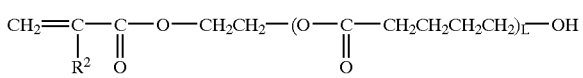

(2)

wherein $R^2$ is a hydrogen atom or methyl group and L is an integer usually from 1–15, and preferably 1–4; and addition reaction products obtained from a glycidyl group-containing compound, such as alkyl glycidyl ether, allyl glycidyl ether, or glycidyl (meth)acrylate, and a (meth)acrylic acid. Of these compounds, 2-hydroxyethyl (meth)acrylate, 2-hydroxypropyl (meth)acrylate, 2-hydroxy butyl (meth)acrylate and 4-hydroxy butyl (meth)acrylate are particularly desirable.

The amount of the hydroxyl group-containing (meth)acrylate compound used is such that the hydroxyl groups in the hydroxyl group-containing (meth)acrylate compound is usually 0.1–2 equivalents, preferably 0.1–1.5 equivalents, for one equivalent of the hydroxyl groups contained in the above polyol compound.

The following methods (I) to (III) are given as examples of methods for manufacturing the urethane (meth)acrylate (A). But, the methods are not necessarily limited to these.

(I) A method of reacting the polyisocyanate compound and a hydroxyl group-containing (meth)acrylate compound, and then reacting the polyol compound.

(II) A method of reacting the polyol compound, polyisocyanate compound, and hydroxyl group-containing (meth)acrylate compound all together.

(III) A method of reacting the polyol compound and polyisocyanate compound, and then reacting the hydroxyl group-containing (meth)acrylate compound.

Among these methods, the methods (I) and (III) are more desirable in view of the high probability of synthesizing the target oligomer and ease of manufacture.

The reaction temperature in these reactions is usually 10–90° C., and preferably 30–80° C.

The reactions (I)–(III) are preferably carried out in the presence of a urethanization catalyst, such as copper naphthenate, cobalt naphthenate, zinc naphthenate, di-n-butyl tin-dilaurate, triethylamine, 1,4-diaza-bicyclo[2.2.2]octane, or 1,4-diaza-2-methylbicyclo[2.2.2]octane. Typically, the catalysts are employed in an amount of 0.01–1 part by weight for 100 parts by weight of the total reactant.

The average functionality of the urethane (meth)acrylate (A) preferably is between about 1.8 and 8, more preferably lower than 4, and particularly preferred, about 2.

The urethane (meth)acrylate (A) typically has a number average molecular weight of 200–30,000. It has been found that urethane (meth)acrylates (A) having a number average molecular weight in the range of 400–20,000, particularly in the range of 600–10,000, provides photocurable resin compositions that are easier to handle and result in cured compositions having higher mechanical characteristics.

The amount of the component (A) to be incorporated into the resin composition is usually 1–94 wt %, and preferably 5–80 wt %, of the total amount of the resin composition. To ensure superior adhesive properties, an amount of 10–70 wt % is particularly preferred. If the amount of the component (A) is too small, adequate adhesive properties cannot be obtained in the substrates; if too large, on the other hand, the viscosity of the composition is increased so that it becomes difficult for the resin composition to be processed with ease.

(Meth)acryloyl Phosphate (B)

The (meth)acryloyl phosphates employed as component (B) are phosphates possessing at least one, preferably one to three, (meth)acryloyl groups in one molecule. The compounds represented by the following general formula (3) can be given as examples of the (meth)acryloyl phosphate (B).

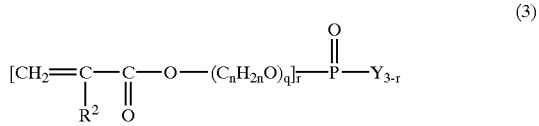

(3)

wherein $R^2$ has the same meaning as defined above; Y is a monovalent organic group.

Generally, Y, if present, represents an organic group with a molecular weight of about 1000 or less, preferably about 500 or less. The group Y may independently be alkyl, aryl and may comprise ether, amine, hydroxyl, urethane and ethylenically unsaturated groups. Suitable examples of group Y are a group which possesses (1) at least one urethane bond (-NHCOO-) and a terminal (meth)acryloyl group, (2) a group represented by the formula, $-OC_aH_{2a+1}$, wherein a is an integer usually from 0–10, preferably 0–5, or (3) a group represented by the formula, $-OC_6H_5$, provided a plurality of Ys may be the same or different. "n" is an integer from 1–10, preferably 1–5. "q" is an integer from 1–10, preferably 1–5. And "r" is an integer from 1–3, preferably 2–3.

A preferred example of Y includes groups represented by the following formula (4):

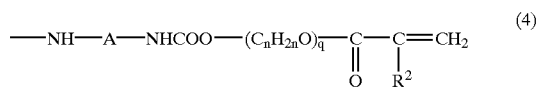

(4)

wherein n, q, and $R^2$ have the same meanings as defined above and A denotes a residual group excluding two $-NCO$ groups from a diisocyanate compound. Other suitable (meth)acryloyl phosphates useful as component (B) include compounds represented by the following formula (5)

(5)

wherein $R^3$, $R^4$, and $R^5$ independently represent a group shown by the formula (6), (7), (8), (9), or (10) or a hydroxyl group, provided that at least one of $R^3$, $R^4$, and $R^5$ is a group represented by the formula (6), (7), (8), or (9):

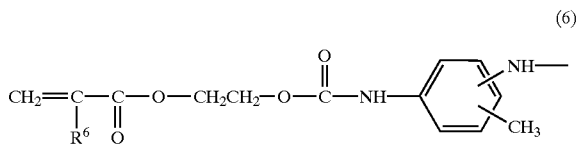

(6)

wherein $R^6$ represents a hydrogen atom or a methyl group;

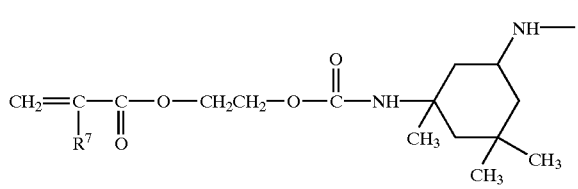

(7)

wherein $R^7$ represents a hydrogen atom or a methyl group;

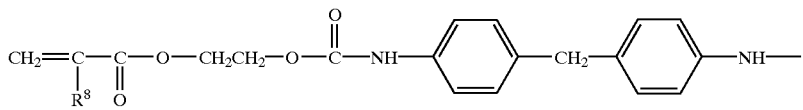

(8)

wherein $R^8$ represents a hydrogen atom or a methyl group;

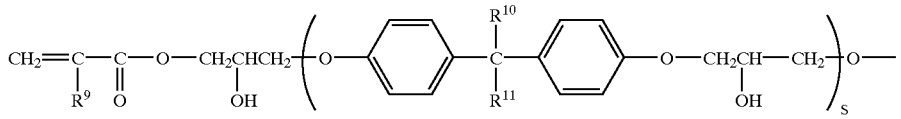

(9)

wherein $R^9$, $R^{10}$, and $R^{11}$ independently represent a hydrogen atom or a methyl group and s denotes a number from 1 to 5; and

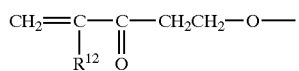

(10)

wherein $R^{12}$ represents a hydrogen atom or a methyl group.

Among these phosphate compounds (B), phosphate compounds which do not have a hydroxyl group combining with a phosphorus atom are preferred.

Given as examples of the (meth)acryloyl phosphate (B) include mono[2-(meth)acryloyloxyethyl]-phosphate, di[2-(meth)acryloyloxyethyl]phosphate, diphenyl-2-methacryloyloxyethyl phosphate, mono[2-(meth) acryloyloxypolypropyloxy]phosphate, di[2-(meth) acryloyloxypolypropyoxy]phosphate, mono[2-(meth) acryloyloxyethyl]diphenyl phosphate, mono[2-(meth) acryloyloxypropyl]phosphate, bis[2-(meth) acryloyloxyethyl]phosphate, bis[2-(meth) acryloyloxypropyl]phosphate, tris[2-(meth) acryloyloxyethyl]phosphate, and the compounds tris (acryloyloxyethyl) phosphate, and the compounds represented by the above formula (3) wherein Y is represented by formula (4), wherein A is the residual group of toluene diisocyanate or isophorone diisocyanate, and wherein "r" is 1 or 2. Preferably, in formula (3), $R^2$ is methyl, whereas the $R^2$ in formula (4) preferably is hydrogen. Other preferred (meth)acryloyl phosphates are those which do not have a hydroxyl group combining with a phosphorus atom.

These (meth)acryloyl phosphates (B) may be used either individually or in combinations of two or more.

The (meth)acryloyl phosphate (B) including the monovalent organic group represented by formula (4), may be prepared, for example, by condensing compound of the general formula (3) (which contains at least one —OH group bonded to a phosphorus atom, hereinafter referred to as "(meth)acryloyl acidic phosphate"), a diisocyanate compound, and a hydroxyl group-containing (meth)acrylate compound.

Here, the same compounds given as examples in the illustration of component (A), preferably 2,4-tolylene diisocyanate and isophorone diisocyanate, are given as the diisocyanate compound.

The amount of the diisocyanate compound used is such that the amount of isocyanate groups contained in the diisocyanate compound is usually 1–4, preferably 1.1–3, equivalents for one equivalent of the OH group bonded to phosphorus atom in the (meth)acryloyl acidic phosphate.

Also, the same compounds given as examples in the illustration of the component (A), preferably 2-hydroxyethyl (meth)acrylate and 2-hydroxypropyl (meth)acrylate, are given as the hydroxyl group-containing (meth)acrylate compounds used here.

The amount of the hydroxyl group-containing (meth) acrylate compound used is usually 0.1–3, preferably 0.5–2, equivalents for one equivalent of the OH group bonded to the phosphorus atom in the (meth)acryloyl acidic phosphate.

There are no specific limitations to the method for preparing the (meth)acryloyl phosphate (B) containing the group represented by formula (4). The following methods (i) to (iii) are given as typical examples.

(i) A method of reacting a diisocyanate compound and a hydroxyl group-containing (meth)acrylate compound, and then reacting a (meth)acryloyl acidic phosphate.

(ii) A method of reacting all three components together.

(iii) A method of reacting the (meth)acryloyl acidic phosphate and a diisocyanate compound, and then reacting the hydroxyl group-containing (meth)acrylate.

Among these, the method (i) is preferred.

In the reactions according to the methods (i)–(iii), an amine-type urethanization catalyst, such as triethylamine, 1,4-diazabicyclo[2.2.2]octane, or 1,4-diaza-2-methylbicyclo [2.2.2]octane, can preferably be used in an amount of 0.01–1 parts by weight for 100 parts by weight of the total reaction components.

The reaction temperature is usually 10–90° C., and preferably 30–80° C.

Further, given as examples of commercially available products which can be used as the component (B) are Light Ester P-M, and P-2M (manufactured by Kyoeisha Chemical Co., Ltd.), Viscoat 3PA (manufactured by Osaka Organic Chemical Industry, Ltd.), EB-169, EB-170, EB-3603, and R-DX63182 (manufactured by Daicel UCB Co., Ltd.), AR-100, MR-100, MR-200 and MR-260 (manufactured by Daihachi Chemical Co., Ltd.), and JAMP-100, JAMP-514 and JPA-514 (manufactured by Johoku Chemical Co., Ltd.). Of these, Light Ester P-2M, AR-100, MR-260, JPA-514, and Viscoat 3PA are preferred, with Viscoat 3PA being particularly preferred.

Preferably, the (meth)acryloyl phosphate (B) has a molecular weight of 150–2000, more preferably 200–1500.

Preferably, the (meth)acryloyl phosphate (B) has, before mixing this compound with the other constituents of the adhesive composition, a low amount of free acid groups. Preferably, the acid number of compound (B) is lower than 50, more preferably lower than 25 and most preferred lower than 10. The acid number represent the number of KOH mg required neutralize 100 g of the (meth)acryloylphosphate (B). More preferably, the (meth)acryloyl phosphate (B) is a compound that contains at least one (meth)acryloyl group but no hydroxyl groups attached to the phosphorus atom.

A (meth)acryloyl phosphate (B) having a higher acid number than required can be reacted with isocyanate compounds, epoxy compounds and the like to have the amount of phosphoric acid groups reduced. It is also possible to simply esterify the acid groups. Suitable reactants for reaction with the acidic phosphate include mono-isocyanates, acrylate group comprising isocyanate compounds, glycidyl acrylate, bisphenyldiglycidyl ether, propene-oxide, cyclohexeneoxide, derivatives therefrom and the like.

The amount of (meth)acryloyl phosphate (B) present in the resin composition should be sufficient to provide adequate adhesive properties, particularly adhesion properties with metal but not excessive so as to cause the cured product to experience increased water absorption and/or exhibit decreased adhesive properties under high temperature—high humidity conditions.

The amount of the (meth)acryloyl phosphate (B) incorporated in the resin composition of the present invention is usually 0.1–30 wt %, preferably 0.1–20 wt %, and more particularly 0.5–10 wt %.

(Meth)acrylate Compound (C)

The component (C) may comprise one or more (meth) acrylate compounds (also referred to herein as a "(meth) acrylate)")having one or more functional groups, and is different (i.e., it does not include) than either the urethane (meth)acrylate oligomer, component (A) or the (meth) acryloyl phosphate, component (B). Preferably, the (meth) acrylate compound is free of urethane and phosphate groups. With this component it is possible e.g. to adjust the viscosity, the cure speed of the photo-curable resin composition, and the hardness of the resulting cured products.

The (meth)acrylate compounds useful as component(C) include both monofunctional and multi-functional compounds.

Given as examples of the monofunctional acrylate monomers include 2-hydroxyethyl (meth)acrylate, 2-hydroxypropyl (meth)acrylate, hydroxy butyl (meth) acrylate, 2-hydroxy butyl (meth)acrylate, 4-hydroxy butyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth) acrylate, t-butyl (meth)acrylate, pentyl (meth)acrylate, isoamyl (meth)acrylate, hexyl (meth)acrylate, heptyl (meth) acrylate, octyl (meth)acrylate, iso-octyl (meth)acrylate, 2-ethylhexyl (meth)acrylate, nonyl (meth)acrylate, decyl (meth)acrylate, iso-decyl (meth)acrylate, undecyl (meth) acrylate, dodecyl (meth)acrylate, lauryl (meth)acrylate, octadecyl (meth)acrylate, stearyl (meth)acrylate, tetrahydrofurfuryl (meth)acrylate, butoxyethyl (meth)acrylate, ethoxydiethylene glycol (meth)acrylate, benzyl (meth)acrylate, cyclohexyl (meth)acrylate, phenoxyethyl (meth)acrylate, polyethylene glycol mono(meth)acrylate, polypropylene glycol mono(meth)acrylate, methoxy ethylene glycol (meth) acrylate, ethoxyethyl (meth)acrylate, ethoxyethoxyethyl (meth)acrylate, methoxypolyethylene glycol (meth)acrylate, methoxy polypropylene glycol (meth)acrylate, dicyclopentadienyl (meth)acrylate, dicyclopentenyl (meth)acrylate, dicyclopentenyloxyethyl (meth)acrylate, tricyclodecanyl (meth)acrylate, isobornyl (meth)acrylate, bornyl (meth) acrylate, dimethylaminoethyl (meth)acrylate, diethylaminoethyl (meth)acrylate, 7-amino-3,7-dimethyloctyl (meth) acrylate, (meth)acryloyl morpholine, 2-(meth)acryloyloxyethylphthalate, 2-(meth)acryloyloxyethylhexahydrophthalate, 2-(meth)acryloyloxypropylphthalate, 2-(meth) acryloyloxypropyltetrahydrophthalate, 2-(meth) acryloyloxypropylhexahydrophthalate, 2-(meth) acryloyloxyethylsuccinate,acryloylmorpholine and bisphenol acrylates, including bisphenol A epoxy acrylate. Examples of monofunctional acrylates also include the compounds represented by the following formulas (11) to (13):

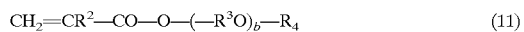

(11)

wherein $R^2$ has the same meaning as defined above, $R^3$ is an alkylene group having 2–6 carbon atoms, $R^4$ is an alkyl or aryl group having 1–25 carbon atoms, and is preferably a phenyl group, optionally substituted with an alkyl group having 1–12 carbon atoms, and b is an integer from 0–12;

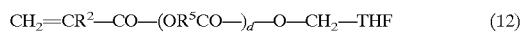

(12)

wherein $R^2$ has the same meaning defined above, $R^5$ is an alkylene group having 2–8 carbon atoms, THF is a tetrahydrofuryl group and d is an integer from 0–8; and

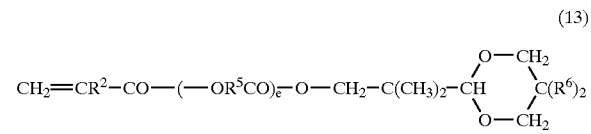

(13)

wherein $R^2$ and $R^5$ have the same meanings as defined above, e is an integer from 0–8, and each $R^6$ independently is a hydrogen atom, an alkyl group having 1–6 carbon atoms, or the group represented by —$R^7$—B, wherein $R^7$ is an alkylene group having 1–6 carbon atoms and B indicates a (meth)acryloyloxy group. These acrylates may be used either individually or in combinations of two or more. Preferred monofunctional acrylates include those which are urethane-free (i.e., do not contain urethane linking groups) and phosphate-free (i.e., do not contain a phosphorus atom) and more particularly monofunctional acrylate monomers which are urethane-free and phosphate-free. In particular, preferred monofunctional (meth)acrylates include phenoxyethylacrylate, acryloylmorpholine, bisphenol A epoxyacrylate, and tetrahydrofurfuryl acrylate.

Suitable multifunctional (meth)acrylate compounds include, for example, ethylene glycol di(meth)acrylate, propylene glycol di(meth)acrylate, 1,4-butanediol di(meth) acrylate, 1,6-hexanediol di(meth)acrylate, 1,9-nonanediol di(meth)acrylate, diethylene glycol di(meth)acrylate, triethylene glycol di(meth)acrylate, tetraethylene glycol di(meth) acrylate, polyethylene glycol di(meth)acrylate, dipropylene glycol di(meth)acrylate, tripropylene glycol di(meth)

acrylate, polypropylene glycol di(meth)acrylate, neopentyl glycol di(meth)acrylate, hydroxypivalic acid neopentyl glycol diacrylate, trimethylolpropane tri(meth)acrylate, pentaerythritol (meth)acrylate, pentaerythritol tetra(meth)acrylate, ditrimethylolpropane tetra(meth)acrylate, dipentaerythritol hexa(meth)acrylate, trimethylolpropane trioxyethyl (meth)acrylate, trimethylolpropane trioxypropyl (meth)acrylate, trimethylolpropane polyethyleneoxyethyl (meth)acrylate, trimethylolpropane polyethyleneoxypropyl (meth)acrylate, tris(2-hydroxyethyl)isocyanurate tri(meth)acrylate, tris(2-hydroxyethyl)isocyanurate di(meth)acrylate, ethoxylated bisphenol A di(meth)acrylate, ethoxylated bisphenol F di(meth)acrylate, propoxylated bisphenol A di(meth)acrylate, propoxylated bisphenol F di(meth)acrylate, tricyclodecanedimethanol di(meth)acrylate, bisphenol A epoxy di(meth)acrylate, and bisphenol F epoxy di(meth)acrylate. These compounds may be used either individually or in combinations of two or more.

Preferred multifunctional (meth)acrylates include hydroxypivalic acid neopentyl glycol diacrylate, tripropylene glycol di(meth)acrylate, tripropylene glycol di(meth)acrylate, ethylene oxide addition trimethylolpropane triacrylate, tris(acryloylethyl)isocyanurate, and 1,6-hexanediol diacrylate.

Given as commercially available products of these acrylates are Aronix M-101, M-102, M-11, M-113, M-114, M-117, M-5300, M-5400, M-5500, M-5600, M110, TO-1317, TO-1301, TO-1249 and TO-1340 (manufactured by Toagosei Co., Ltd.), KAYARAD TC110S, R629 and R644 (manufactured by Nippon Kayaku Co., Ltd.), LA, STA, IBXA, DMA, Viscoat #158, #190, #192, #2000, #2100, #2150, #2180 and #3700 (manufactured by Osaka Organic Chemical Industry, Ltd.), NK Ester SA, and A-SA (manufactured by Shin-Nakamura Chemical Co., Ltd.), Light Acrylate L-A, S-A, BO-A, EC-A, DPM-A (manufactured by Kyoeisha Chemical Co., Ltd.) and FA-511A, FA-512A, FA-513A (manufactured by Hitachi Chemical Co., Ltd.), and ACMO (manufactured by Kojin Co., Ltd.), Yupimer UV SA1002 and SA2007 (manufactured by Mitsubishi Chemical Corp.), Viscoat #195, #215, #230, #260, #295, #300, #310, #312, #360, #400 and #700 (manufactured by Osaka Organic Chemical Industry, Ltd.), KAYARAD MANDA, DPHA, NPGDA, R-604, DPCA20,-30,-60,-120, HX-620, D-310 and D-330 manufactured by Nippon Kayaku Co., Ltd.), Aronix M-210, M-215, M-220, M-270, M-310, M-315, M-325, M-350, M-360, M-400, M-450, M-6100, M-6500, M-7100, M-8030 and M-8530 (manufactured by Toagosei Co., Ltd.), 3EG-A, BP-4EA, BP-4PA, PE-3A, TMP-A, PE-4A (manufactured by Kyoeisha Chemical Co., Ltd.), VR-77, VR-60 and VR-90 (manufactured by Showa Highpolymer Co., Ltd.), and SR-355 (manufactured by Sartomer Co., Ltd.). Of these, IBXA, Viscoat #192, M110, TO-1317, FA-511A, FA-512A, FA-513A and ACMO are particularly desirable monofunctional (meth)acrylates and KAYARAD MANDA, R-604, Viscoat #300, Viscoat #295, VR-77, VR-90, TMP-A, and PE-3A are preferred multifunctional (meth)acrylates.

In a preferred embodiment of the invention, the component (C), or reactive diluent, comprises one or more compounds comprising at least one hydroxy group and at least one radical polymerizable ethylenically unsaturated group, having a number average Mw of preferably less than 2,000, more preferably 80–1,000, such compounds include hydroxybutyl vinylether, hydroxyethyl vinyl ether, hydroxyethylacrylate, 4-hydroxybutylacrylate, pentaerythritolmonoacrylate, trimethylolpropenetriol monoacrylate, trimethylolpropane triol diacrylate, 2-hydroxy-1-phenyl-3-acrylate and alkoxylated trimethylolpropanetriol-diacrylate.

It appeared, that 4-hydroxybutylacrylate is preferred monomer for a plurality of technical reasons (e.g., adhesion and minor skin sensitivity). Hence, the more generalize The molecular weight of the multifunctional (meth)acrylate (C) is usually 100–3,000, and preferably 200–2,000.

Component (C) should be present in the resin composition in an amount sufficient to provide a cured product that is sufficiently hard to avoid gaps and/or displacement between laminated substrates joined by the cured product. On the other hand, the amount of component (C) present in the composition should not be too high so as to provide a cured product having inadequate adhesive properties.

The amount of the component (C) incorporated into the composition of the present invention is usually 5-85 wt %, preferably 10–80 wt %, and particularly preferably 15–70 wt %.

Photopolymerization Initiator (D) (Optional)

Photopolymerization initiators commonly used with conventional photocurable resin compositions can be used as component (D) in the present invention without specific restrictions. Such commonly used photo-initiators include 1-hydroxycyclohexyl phenyl ketone, 2,2-dimethoxy-2-phenylacetophenone, xanthone, fluorenone, benzaldehyde, fluorene, anthraquinone, triphenylamine, carbazole, 3-methylacetophenone, 4-chlorobenzophenone, 4,4'-dimethoxybenzophenone, 4,4'-diaminobenzophenone, Michler's ketone, benzoin propyl ether, benzoin ethyl ether, benzyl methyl ketal, 1-(4-isopropylphenyl)-2-hydroxy-2-methylpropan-1-one, 2-hydroxy-2-methyl-1-phenylpropan-1-one, thioxanethone, diethylthioxanthone, 2-isopropylthioxanthone, 2-chlorothioxanthone, 2-methyl-1-[4-(methylthio) phenyl]-2-morpholino-propanon-1, 2,4,6-trimethylbenzoyl diphenylphosphine oxide, 2-benzyl-2-dimethylamino-1-(4-morpholino phenyl)-butanone-1 and bis(2,6-dimethoxy-benzoyl)-2,4,4-trimethylpentyl phosphine oxide. Further, the following products are given as examples of commercially available photopolymerization initiator (D): Lucirin TPO and Lucirin LR8728 (manufactured by BASF), Irgacure 184, 907 and 369 and CGI-1700 and 1850 (manufactured by Ciba-Geigy Ltd.), Darocur 1116, 1173 and 4265 (manufactured by Merck Co.), Ubecryl P36 (manufactured by UCB Co.), and Kayacure ITX, QTX, DETX and BMS (manufactured by Nippon Kayaku Co., Ltd.). Of these photopolymerization initiators, Lucirin TPO, Irgacure 184 and 369, CGI-1850, Kayacure ITX and DETX are especially desirable.

These photopolymerization initiators may be used either individually or in combinations of two or more.

The amount of the component (D) used in the composition of the present invention is usually 0.1–15 wt %, preferably 0.5–10 wt %, and particularly preferably 1–5 wt %.

Oroanosilyl-Containing Mercapto Compound (E) (Optional)

Photocurable compounds may optionally include a mercapto compound, understood herein to mean a compound having at least one mercapto group, having at least one organosilyl group (herein referred to as a "organosilyl-containing mercapto compounds"). Preferably, the organosilyl group is one represented by the formula -SIR$^a$R$^b$R$^c$, wherein R$^a$, R$^b$, and R$^c$ independently represent an alkyl group, an alkoxy group, a phenyl group, a halogen atom, or a hydrogen atom.

Examples of the alkyl group represented by R$^a$, R$^b$, and R$^c$ in the above formula include a methyl group, ethyl group, propyl group, butyl group, pentyl group, and hexyl group. Examples of the alkoxy group include a methoxy group, ethoxy group, propoxy group, and butoxy group, and examples of the halogen atom include a fluorine atom, chlorine atom, and bromine atom.

Examples suitable organosilyl-containing mercapto compound (E) are:
- γ-mercaptopropylmethylmonomethoxysilane,
- γ-mercaptopropylmethyldimethoxysilane,
- γ-mercaptopropyltrimethoxysilane,
- γ-mercaptopropylmonoethoxysilane,
- γ-mercaptopropyldieth oxysilane,
- γ-mercaptopropyltriethoxysilane,
- β-mercaptoethylmonoethoxysilane,
- β-mercaptoethyltriethoxysilane, and
- β-mercaptoethyltriethoxysilane. Of these compounds,
- γ-mercaptopropyltrimethoxysilane,
- γ-mercaptopropylmethyldimethoxysilane, and
- β-mercaptoethyltriethoxysilane are especially desirable.

These compounds may be used either independently or in combinations of two or more.

Suitable organosilyl-containing mercapto compound (E) are commercially available under the trade names, for example, SH6062, AY43-062 (manufactured by Toray-Dow Corning Silicone Co.).

The proportion of the organosilyl-containing mercapto compound (E) in the composition of the present invention is generally 0.01 parts by weight or more, preferably from 0.05 to 20 parts by weight, and most preferably from 0.1 to 10 parts by weight, for 100 parts by weight of the total amount of components (A), (B), and (C). If the proportion is too small, adhesion to a substrate to be coated, particularly to a metal substrate, is insufficient.

It will be appreciated that while photocurable compositions comprising a (meth)acryloyl phosphate (B) and an organosilyl-containing mercapto compound (E) make suitable adhesives for laminating together the layers of a multilayer optical disk, preferred adhesives are those photocurable compositions that further include an urethane (meth)acrylate oligomer (A), a multifunctional (meth)acrylate compound and, if required, a photopolymerization initiator (D).

Other Components

Besides the above-mentioned components (A) to (E), various components such as a photopolymerization accelerator, monofunctional (meth)acrylates, vinyl compounds, and various additives can be incorporated into the composition of the present invention as necessary for the particular application.

The following compounds are given as examples of photopolymerization accelerators. Triethylamine, diethylamine, N-methyldiethanoleamine, ethanolamine, 4-dimethylaminobenzoate, 4-methyldimethylaminobenzoate, 4-ethyldimethylaminobenzoate, and 4-isoamyldimethylamino-benzoate. As commercially available products of these photopolymerization accelerators, Ubecryl P102, 103, 104 and 105 (manufactured by UCB Co.), KAYACURE DMBI and EPA (manufactured by Nippon Kayaku Co., Ltd.), and the like are given. The photopolymerization accelerators are added to the composition in an amount usually of 0–10 wt %, and preferably 0–5 wt %.

N-vinyl caprolactam and N-vinyl pyrrolidone are given as examples of a preferred vinyl compound.

As various additives, silane coupling agents, antioxidants, UV absorbers, light stabilizers, aging preventives, polymerization inhibitors, preservatives, plasticizers, and the like are given.

Given as examples of silane coupling agents are N-(2-aminoethyl)-3-aminopropylmethyl-dimethoxysilane, N-(2-aminoethyl)-3-aminopropyl-methylmethoxysilane, N-(2-amino ethyl)-3-amino-propyltrimethoxysilane, N-(2-aminoethyl)-3-aminopropyl-trimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxy-silane, 3-chloropropylmethyldimethoxysilane, 3-chloropropyl-trimethoxysilane, and 3-methacryloyloxypropyltrimethoxy-silane, and commercially available products, such as Saila Ace S310, S311, S320, S321, S330, S510, S520, S530, S610, S620, S710 and S810 (manufactured by Chisso Corp.), SH6020, SZ6023, SZ6030, SH6040, SH6062, SH6076 and SZ6083 (manufactured by Toray-Dow Corning Silicone Co.), and KBM403, KBM503, KBM603, KBM602, KBM803 and KBE903 (manufactured by Shin-Etsu Silicone Co., Ltd.)

As antioxidants, phenol-based antioxidants, organic sulfur-based antioxidants, and commercially available products, such as Irganox 1010, 1035, 1076 and 1222 (manufactured by Ciba-Geigy Ltd.), and the like are given as examples.

As UV absorbers, benzotriazole-type UW absorbers and the like can be given. As commercially available products of the UV absorbers, Tinuvin P, 234, 320, 326, 327, 328 and 213 (manufactured by Ciba-Geigy Ltd.), Sumisorb 110, 130, 140, 220, 250, 300, 320, 340, 350 and 400 (manufactured by Sumitomo Chemical Industries Co., Ltd.), and the like are given as examples.

As light stabilizers, hindered amine-type light stabilizers are given. As commercially available products of the light stabilizers, Tinuvin 292, 144, 622LD (manufactured by Ciba Geigy), Sanol LS-700, 765, 292, 2626, 1114 and 744 (manufactured by Sankyo Co., Ltd.), and the like are given as examples.

As examples of aging preventives, phenol-based aging preventives, allylamine-based aging preventives, and ketone amine-based aging preventives are given. Commercially available products of aging preventives include Antigen W, S, P, 3C, 6C, RD-G, FR and AW (manufactured by Sumitomo Chemical Industries Co., Ltd.).

These additives may be present in amount provided that the addition of these additives does not adversely affect the objects of the present invention. One of ordinary skill in the art, based on the particulars of the given application, the readily determine the amounts of a given additive to employ.

The composition of the present invention can be prepared by blending the above-described components by a conventional method. The resulting composition may have a viscosity of 20–20,000 mPa.s at 25° C. To ensure processability and ease of application to disk substrates, a viscosity in the range of 50–10,000 mPa.s at 25° C., particularly 100–2,000 mpa.s, is more desirable.

It is desirable that the various components are blended in proportions such that the glass transition temperature (commonly abbreviated as "Tg")of the resulting cured products is in the range of –30 to 200° C., preferably 0 to 150° C. and more preferably 30 to 120° C. If the glass transition temperature is too low, the cured products becomes so soft that substrates may be displaced when bonded; if the amount is excessive, on the other hand, sufficient adhesion cannot be obtained and substrates may bend.

Here, the glass transition temperature is defined to be the temperature at which the loss tangent (tan δ) is maximum at a vibration frequency of 10 Hz in a dynamic viscoelasticity measuring instrument.

The composition of the present invention can be cured by irradiating with ultraviolet light, visible rays, electron beams, or the like in the same manner as conventional photocurable resin compositions are cured. For example, the composition may be applied to a substrate to make a film with a thickness of about 50 μm and can be substantially cured by irradiating with ultraviolet light from a metal halide lamp with a dominant wavelength of 365 nm at a suitable dose. Generally a dose of less than 1000 mJ/cm$^2$ is sufficient, and the dose may be as low as 10 mJ/cm$^2$. In practise, a dose of between 50–500 mJ/cm$^2$ often will be used to cure the composition of the present invention.

It is desirable that the cured products have excellent transparency, for example, a cured product with a thickness of about 100 μm should have a transmittance of 90% or more at a wavelength of 500–600 nm. If the transmittance is less than 90%, not only the external appearance of the disks is impaired, but also there may be problems in reading the recording layer by laser beams. Therefore, when the composition of the present invention is manufactured, the various components should be blended at proportions to provide a transmittance in this range.

In addition, the proportion of various components should be determined so as to make the refractive index of the cured products 1.50–1.60 at 25° C. If the refractive index is outside this range, errors may occur in reading the recording layer by laser beams.

The cured products of the composition of the present invention exhibit high adhesive properties to substrates made of a plastic such as polycarbonate (PC) or polymethyl methacrylate (PMMA), a metal such as aluminum or gold, and an inorganic compound such as glass, and the like. The adhesion is excellent in a wide temperature range (for example 0–60° C.) and is stable under high temperature-high humidity conditions, indicating superior durability of the composition. Even when compositions of the present invention experience water absorption as high as conventional adhesives, the corrosion exhibited by the adjacent metal susbtrate is slight or none.

Photocurable resin compositions of the present invention typically provide an adhesion property test value of greater than about 70, preferably 75–100 squares remaining. In particular, the photocurable resin composition of the present invention will provide at least about 90, preferably 95–100, squares remaining when tested on a PC substrate; greater than about 70, preferably 80–100, squares remaining when test on an Aluminium sputtered PC substrate; greater than about 70, preferably 75–100, squares remaining when tested on a gold sputtered PC substrate; and/or greater than about 90, preferably 95–100, squares remaining when tested on quartz substrate.

Photocurable resin composition of the present invention typically provide an adhesion property test value of greater than 50, preferably greater than 75, squares remaining when measured under high temperature—high humidity conditions and an aluminium sputtered PC susbtrate.

The photocurable resin compositions of the present invention should provide a light transmittance of less than about 50%, preferably less than 20%, when an aluminium sputtered PC board is exposed to high temperature—high humidity conditions in accordance with the Aluminium corrosion test set forth in the Examples.

Accordingly, the composition of the present invention is particularly useful as an adhesive for optical disks requiring high adhesive properties to plastics, metals, inorganic compounds, and the like.

EXAMPLES

The following examples of the present invention are presented for illustration purposes but shall not be construed as limiting the present invention.

Synthesis of Urethane Acrylate (A)

Synthetic Example 1

23.0 g of isophorone diisocyanate, 69.0 g of PNOC1000 (trademark for polycarbonate diol manufactured by Kuraray Co., Ltd.), and 0.02 g of 2,6-di-t-butyl-methyl phenol as a polymerization inhibitor were fed into a reaction vessel equipped with a stirrer. After cooling to 20° C. or lower over a water bath, 0.08 g of di-n-butyl tin dilaurate was added to initiate the reaction. The mixture was reacted for two hours while controlling the temperature at 20–35° C. Then, after the addition of 8.0 g of 2-hydroxyethyl acrylate, the mixture was stirred at 40–60° C. for five hours, whereupon the reaction was terminated to obtain urethane acrylate (A-1) with a number average molecular weight of about 3,000.

Synthetic Example 2

The same experiment as in Synthetic Example 1 was carried out except for using 69.0 g of Kurapol P1010 (a trademark of polyester diol manufactured by Kuraray Co., Ltd.) instead of PNOC1000, to obtain urethane acrylate (A-2) with a number average molecular weight of 3,000.

Synthesis of Methacryloyl Phosphate (B)

Synthetic Example 3

To a reaction vessel equipped with a stirrer, 50.1 g of isophorone diisocyanate, 0.02 g of 2,6-di-t-butyl-methyl phenol as a polymerization inhibitor, and 0.08 g of di-n-butyl tin dilaurate were added. Then, 26.2 g of 2-hydroxyethyl acrylate was added dropwise and the mixture was reacted, while controlling the temperature to 30° C. or lower over a water bath. Next, 23.7 g of mono(2-methacryloyloxyethyl) acidic phosphate and 0.1 g of triethylamine were added, and the mixture was reacted for five hours while stirring at 40–60° C. The reaction was terminated to obtain a compound with the following formula.

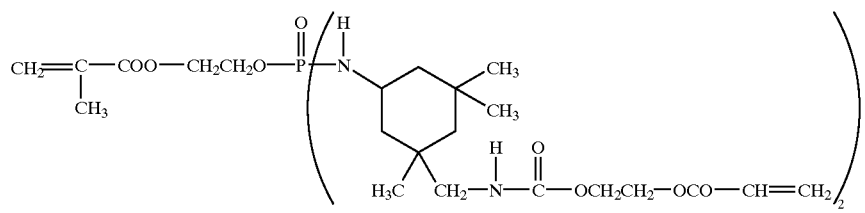

This compound is designated as methacryloyl phosphate (B-1) and served as a material to prepare the composition in Example 2.

Example 1

(1) Preparation of a Photocurable Resin Composition

A vessel equipped with a stirrer was charged with 30.0 g of urethane acrylate (A-1), 29.0 g of isobornyl acrylate, 15.0 g of phenoxyethyl acrylate, 20.0 g of bisphenol A diepoxy acrylate, 2.0 g of tris(acryloyloxyethyl)phosphate as an acryloyl phosphate, 3.0 g of 1-hydroxycyclohexylphenyl ketone as a photopolymerization initiator, and 1.0 g of 3-mercaptopropyltrimethoxysilane as a silane coupling agent. The mixture was blended at 50–60° C. to obtain the composition of the present invention. The viscosity of the composition was 600 mpa.s at 25° C.

(2) Preparation and Evaluation of Cured Product

The following tests were carried out using the composition prepared in (1) above.

2.1 Adhesion Property Test

The composition prepared in (1) above was coated on to a polycarbonate (PC) board, an aluminum sputtered PC board, a gold sputtered PC board, and a quartz substrate to produce a film with a thickness of 50 μm. The composition were irradiated with ultraviolet light (light source: metal halide lamp) at a dose of 50 mJ/cm$^2$ in a nitrogen atmosphere to obtain cured test specimens. The cross-cut test according to JIS D0202 was carried out using the cured test specimens, wherein the number of squares of cross-cut cured film left on the board without being peeled off was counted. The results are shown in Table 2. The total number of squares initially existing on the board was 100.

2.2 Adhesion Characteristics Under High Temperature—High Humidity Conditions

Cured test specimens prepared in the same manner as in 2.1 above using the aluminum sputtered PC board were allowed to stand in a thermo-hygrostat at 70° C. and 95% RH for 96 hours. Moisture on the test specimens was wiped off and the cross-cut test was carried out in the same manner as in 2.1 above. The results are shown in Table 2.

2.3 Aluminum Corrosion Test

Cured test specimens prepared in the same manner as in 2.1 above using the aluminum sputtered PC board were allowed to stand in a thermo-hygrostat at 70° C. and 95% RH for 96 hours. Then, transmittance of the test specimens at 500 nm was measured using a spectrophotometer manufactured by Hitachi, Ltd. Aluminum corrosiveness was evaluated as an increase in the transmittance accompanied by dissolution of aluminum due to corrosion. The results are shown in Table 2. The transmittance of the test specimens before the test is 0% because of the existence of the aluminum layer.

2.4 Water Absorption

Water absorption of the cured films was measured according to JIS K7209 using the cured test specimens (substrate: quartz glass) prepared in the same manner as in 2.1 above. The results are shown in Table 2.

2.5 Glass Transition Temperature

The glass transition temperature of the cured films was measured using a compulsory resonance vibration type dynamic viscoelasticity measuring instrument (manufactured by Orientech Co., Ltd.) using the cured test specimens (substrate: quartz glass) prepared in the same manner as in 2.1 above. The temperature at which the loss tangent (tan δ) is maximum at a vibration frequency of 10 Hz was measured. The results are shown in Table 2.

2.6 Transparency

One drop of the composition was placed between two sheets of slide glass with a thickness of 1 mm each to produce a film. The thickness of the cured film was adjusted to 1 mm using a spacer. The composition was irradiated with ultraviolet light at a dose of 50 mJ/cm$^2$ to obtain a cured test specimen. The transmittance of light with a wavelength of 500 nm or 600 nm of the cured test specimen was measured using the same spectrophotometer as the used in the above experiment. The results are shown in table 2.

Example 2

A composition of the present invention was prepared in the same manner as in Example 1, except that 2.0 g of methacryloyl phosphate (B-1) was used instead of 2.0 g of the tris(acryloyloxyethyl)phosphate. The viscosity of the resulting composition was 600 mpa.s. The composition was evaluated in the same manner as Example 1. The results are shown in Table 2.

Example 3

A vessel equipped with a stirrer was charged with 30.0 g of urethane acrylate (A-2), 29.0 g of dicyclopentenyl acrylate, 15.0 g of phenoxyethyl acrylate, 20.0 g of hydroxypivalic acid glycol diacrylate, as the multifunctional acrylate, 2.0 g of tris(acryloyloxy ethyl)phosphate as an acryloyl phosphate, 3.0 g of 2,4,6-trimethylbenzoyl diphenylphosphine oxide as a photopolymerization initiator, and 1.0 g of 3-methacryloyloxypropyltrimethoxysilane as a silane coupling agent. The mixture was blended at 50–60° C. to obtain a composition of the present invention. The viscosity of the composition was 700 mPa.s. The composition was evaluated in the same manner as in Example 1. The results are shown in Table 2.

Example 4

A composition of the present invention was prepared in the same manner as in Example 3, except that 3.0 g of di(2-acryloyloxyethyl) phosphate was used instead of 2.0 g of the tris(acryloyloxyethyl) phosphate and the addition of the 3-methacryloyloxypropyl-trimethoxysilane was omitted. The viscosity of the resulting composition was 700 mPa.s. The composition was evaluated in the same manner as in Example 1. The results are shown in Table 2.

Example 5

A composition of the present invention was prepared in the same manner as in Example 1, except that the amount of the urethane acrylate (A-1) was changed to 15.0 g and 15.0 g of urethane acrylate (A-2) was added. The viscosity of the resulting composition was 700 mPa.s. The composition was evaluated in the same manner as in Example 1. The results are shown in Table 2.

Comparative Example 1

A vessel equipped with a stirrer was charged with 34.0 g of isobornyl acrylate, 20.0 g of phenoxyethyl acrylate, 40.0 g of bisphenol A diepoxy acrylate, 2.0 g of trisacryloyloxyethyl phosphate as an acryloyl group-containing phosphate, 3.0 g of 1-hydroxycyclohexylphenyl ketone as a photopolymerization initiator, and 1.0 g of 3-mercaptopropyltrimethoxysilane as a silane coupling agent. The mixture was blended at 50–60° C. to obtain a composition of the present invention. The viscosity of the composition was 800 mPa.s. The composition was evaluated in the same manner as in Example 1. The results are shown in Table 2.

Comparative Example 2

A composition of the present invention was prepared in the same manner as in Example 1, except that the addition of trisacryloyloxyethyl phosphate was omitted and the amount of the bisphenol A diepoxy acrylate was changed from 20.0 g to 22.0 g. The viscosity of the resulting composition was 650 mPa.s. The composition was evaluated in the same manner as in Example 1. The results are shown in Table 2.

and a thermometer. The mixture was stirred and cooled to 10° C. in a cold water bath in dry air. 109 g of 2-hydroxyethylacrylate was gradually added to the mixture and reacted over one hour while controlling the temperature at 10 to 35° C. Then, 480 g of polytetramethylene glycol (trade name: PTMG1000, manufactured by Mitsubishi Chemical Corp.) having a hydroxyl equivalent of 109.7 mg KOH/g was added and the resulting mixture was stirred at 40

TABLE 1

| | | EXAMPLE | | | | | COMP. EXAMPLE | |
|---|---|---|---|---|---|---|---|---|
| | | 1 | 2 | 3 | 4 | 5 | 1 | 2 |
| Components | | | | | | | | |
| (A) | Urethane acrylate (A-1) | 30.0 | 30.0 | — | — | 15.0 | — | 30.0 |
| | Urethane acrylate (A-2) | — | — | 30.0 | 30.0 | 15.0 | — | — |
| (B) | Trisacryloyloxyethyl phosphate | 2.0 | — | 2.0 | — | 2.0 | 2.0 | — |
| | Di(2-acryloyloxyethyl) phosphate | — | — | — | 3.0 | — | — | — |
| | Methacryloyl phosphate (B) | — | 2.0 | — | — | — | — | — |
| (C) | Bisphenol A diepoxy acrylate | 20.0 | 20.0 | — | — | 20.0 | 40.0 | 22.0 |
| | Hydroxypivalic acid glycol diacrylate | — | — | 20.0 | 20.0 | — | — | — |
| (D) | 1-Hydroxycyclohexylphenyl ketone | 3.0 | 3.0 | — | — | 3.0 | 3.0 | 3.0 |
| | 2,4,6-Trimethylbenzoyl diphenylphosphine oxide | — | — | 3.0 | 3.0 | — | — | — |
| Isobornyl acrylate | | 29.0 | 29.0 | — | — | 29.0 | 34.0 | 29.0 |
| Phenoxyethyl acrylate | | 15.0 | 15.0 | 15.0 | 15.0 | 15.0 | 20.0 | 15.0 |
| Dicyclopentenyl acrylate | | — | — | 29.0 | 29.0 | — | — | — |
| 3-Mercaptopropyltrimethoxysilane | | 1.0 | 1.0 | — | — | 1.0 | 1.0 | 1.0 |
| 3-Methacryloyloxypropyltrimethoxysilane | | — | — | 1.0 | — | — | — | — |

TABLE 2

| | EXAMPLE | | | | | COMP. EXAMPLE | |
|---|---|---|---|---|---|---|---|
| | 1 | 2 | 3 | 4 | 5 | 1 | 2 |
| Evaluation | | | | | | | |
| Adhesion properties (remaining) | | | | | | | |
| PC substrate | 100 | 100 | 100 | 100 | 100 | 10 | 90 |
| Aluminum sputtered PC substrate | 100 | 100 | 100 | 90 | 100 | 70 | 5 |
| Gold sputtered PC substrate | 100 | 100 | 80 | 75 | 100 | 70 | 5 |
| Quartz substrate | 90 | 100 | 95 | 90 | 100 | 90 | 90 |
| Adhesion properties under high temperature-high humidity conditions[1] | 95 | 100 | 95 | 80 | 95 | 10 | 0 |
| Aluminum corrosion under high temperature-high humidity conditions (%)[2] | 0 | 5 | 0 | 10 | 0 | 85 | 95 |
| Water absorption[3] | 1.7 | 2.0 | 1.9 | 2.3 | 1.8 | 1.2 | 1.8 |
| Glass transition temperature (° C.)[3] | 55 | 55 | 60 | 65 | 60 | 120 | 50 |
| Transparency (%) | | | | | | | |
| 500 nm | 99 | 98 | 94 | 94 | 98 | 98 | 98 |
| 600 nm | 100 | 99 | 98 | 98 | 98 | 99 | 98 |

Notes for Table 2
[1]Substrate: Aluminum sputtered PC substrate
[2]Substrate: Aluminum sputtered PC substrate
[3]Substrate: Quartz substrate Synthesis of Urethane Acrylate for Component (A)

Preparation A3

209 g of isophorone diisocyanate, 0.2 g of 3,5-di-t-butyl-4-hydroxytoluene, and 0.8 g of di-n-butyltin dilaurate were placed in a separable flask (1 liter) equipped with a stirrer to 60° C. for 5 hours to react, thus obtaining urethane acrylate (A3) having a number average molecular weight of 1650.

Preparation Example A4

Urethane acrylate (A4) having a number average molecular weight of 1530 was prepared in the same manner as in Preparation Example A3, except that 472 g of polyester diol (trade name: Kurapol P1010, manufactured by Kuraray Co., Ltd.) having a hydroxyl equivalent of 111.7 mg KOH/g was used instead of polytetramethylene glycol as in the Preparation Example A3.

Preparation Example A5

Urethane acrylate (A5) having a number average molecular weight of 2570 was prepared in the same manner as in Preparation Example A3, except that 956 g of polyether diol (trade name:PTG-L 2000, manufactured by Hodogaya Chemical Co., Ltd.) having a hydroxyl equivalent of 55.2 mg KOH/g was used instead of polytetramethylene glycol used in Preparation Example A3.

Examples 6–12 and Comparative Examples 3–9
<Preparation of Compositions for Forming a Radiation Curable Coating Film>

The components for examples shown in Table 3 were placed in a reaction vessel equipped with a stirrer and mixed with stirring to prepare example compositions. Also, the components for the comparative examples shown in Table 4 were mixed in the same manner as above to prepare comparative compositions.

The components A3 to A5 shown in Tables 3 and 4 indicate urethane acrylates A3 to A5 synthesized in Preparation Examples A3 to A5.

The other components are as follows, provided that the component (G) was used in Comparative Examples instead of the component (D).

Component (B)
  B1: tris[2-(meth)acryloyloxyethyl] phosphate (trade name: Viscoat 3PA, manufactured by Osaka Organic Chemical Industry Co., Ltd.)

Component (C)
  C1: phenoxyethylacrylate (trade name: Viscoat 192, manufactured by Osaka Organic Chemical Industry Co., Ltd.)
  C2: acryloylmorpholine (trade name: ACMO, manufactured by Kojin Co., Ltd.)
  C3: bisphenol A epoxyacrylate (trade name: VR77, manufactured by Showa Highpolymer Co., Ltd.)
  C4: hydroxypivalic acid neopentyl glycol diacrylate (trade name: KAYARAD MANDA, manufactured by Nippon Kayaku Co., Ltd.)
  C5: tripropylene glycol di(meth)acrylate (trade name: APG-200, manufactured by Shin-Nakamura Chemical Co., Ltd.)
  C6: ethylene oxide addition trimethylolpropane triacrylate
  C7: tris(acryloyloxyethyl)isocyanurate (trade name: Aronix M-315, manufactured by Toagosei Co., Ltd.)
  C8: 1,6-hexanediol diacrylate (trade name: 1·6-HX-A, manufactured by Kyoeisha Chemical Co., Ltd.)
  C94: tetrahydrofurfuryl acrylate (trade name: Viscoat #150)

Component (D)
  D1: γ-mercaptopropyltrimethoxysilane (trade name: SH6062, manufactured by Toray-Dow Corning Silicone Co.)
  D2: γ-mercaptopropylmethyldimethoxysilane (trade name: AY43-062, manufactured by Toray-Dow Corning Silicone Co.)

Component (E)
  E1: 1-hydroxycyclohexylphenyl ketone (trade name: Irgacure184, manufactured by Ciba-Geigy)
  E2: 2-methyl-1-[4-(methylthio)phenyl]-2-morpholino-propan-1-one (trade name: Irgacure907, manufactured by Ciba-Geigy)
  E3: 2,4,6-trimethylbenzoyl diphenylphosphine oxide (trade name: Lucirin TPO, manufactured by BASF)
  E4: 2,4,6-trimethylbenzoyl phenylphosphinate (trade name: Lucirin LR8893, manufactured by BASF)
  E5: bis(2,4,6-trimethylbenzoyl)-phenylphosphine oxide (trade name: CGI-819, manufactured by Ciba-Geigy)
  E6: 2-benzyl-2-dimethylamino-1-(4-morpholinophenyl)-butan-1-one (trade name: Irgacure 369, manufactured by Ciba-Geigy)

Component (F)
  F1: N-vinyl pyrrolidone
  F2: N-vinyl caprolactam

Component (G)
  G1: decyl mercaptan (trade name: AY43-210MC, manufactured by Toray-Dow Corning Silicone Co.)
  G2: cetyl mercaptan
  G3: γ-(2-aminoethyl)aminopropyltrimethoxysilane (trade name: SH6020, manufactured by Toray-Dow Corning Silicone Co.)
  G4: γ-methacryloxypropyltrimethoxysilane (trade name: SZ6030, manufactured by Toray-Dow Corning Silicone Co.)
  G5: γ-glycidoxypropyltrimethoxysilane (trade name: SH6040, manufactured by Toray-Dow Corning Silicone Co.)

The viscosity, adhesion to a substrate, moisture-heat resistance of each composition prepared in Examples and Comparative Examples were measured and evaluated according to the following methods.

(1) Viscosity

The viscosity was measured at 252C using a B-type viscometer (type: BM, rotor: No. 2, manufactured by Tokyo Keiki Co., Ltd.).

(2) Adhesion to a Substrate

Adhesion to a Polycarbonate:

The composition was applied to a PC substrate (trade name: Panlite, manufactured by Teijin Chemicals Ltd.) using a spin coater. The coating was irradiated with ultraviolet light and visible rays in a nitrogen atmosphere using a conveyer-type UV light curing apparatus equipped with a metal halide lamp (manufactured by Eye Graphics Co., Ltd.) to form a cured layer with a thickness of 50 μm. The dose of the irradiated light, measured using an integrating UV light dosimeter (manufactured by Eye Graphics Co., Ltd.) was 100 mJ/cm$^2$. The cured coating was then subjected to the cross-cut cellophane tape peeling test (JIS K5400). In this test, two cross-cut notches, which were 1 cm long in length and breadth and which crossed at the center of the cured coating at a right angle, were formed using a cutter knife and the cellophane tape was applied to the notches and then rapidly peeled off. When the cured coating was peeled off in the cellophane tape peeling test, the adhesion was determined to be low and this case was indicated by "U" (used herein represent an "Unsatisfactory" result) in Tables 5 and 6. When the cured coating was not peeled off, the adhesion was determined to be high and this case was indicated by "S" (used herein to represent a "Satisfactory" result) in Tables 5 and 6.

Adhesion to Aluminum:

The composition was applied to an aluminum coating formed by vapor deposition using a sputtering method on the same PC substrate as that used in the above test using a spin coater. The coating was irradiated with light in a nitrogen atmosphere at a dose of 100 mJ/cm² using a conveyer-type UV light curing apparatus equipped with a metal halide lamp (manufactured by Eye Graphics Co., Ltd.) to form a cured coating with a thickness of 50 μm. The cured coating was then subjected to the cross-cut cellophane tape peeling test and the test was carried out in the same manner as in the case of the PC substrate. When the aluminum coating which was still adhering to the cured coating of the adhesive was peeled off from the PC substrate, the adhesion was determined to be high and this case was indicated by "S" in Tables 5 and 6. When the aluminum coating was not peeled off at all, the adhesion was determined to be low and this case was indicated by "U" as shown in Tables 5 and 6.

Adhesion to Gold:

The composition was applied to a gold coating formed by vapor deposition using a sputtering method on the same PC substrate as that used in the above test using a spin coater. The coating was irradiated with light in a nitrogen atmosphere at a dose of 100 mJ/cm² using a conveyer-type UV light curing apparatus equipped with a metal halide lamp (manufactured by Eye Graphics Co., Ltd.) to form a cured coating with a thickness of 50 μm. The cured coating was then subjected to the cross-cut cellophane tape peeling test and the test was carried out in the same manner as in the case of the PC substrate. When the gold coating which was still adhering to the cured coating of the adhesive was peeled off from the PC substrate, the adhesion was determined to be high and this case was indicated by "S" in Tables 5 and 6. When the gold coating was not peeled off at all, the adhesion was determined to be low and this case was indicated by "U" in Tables 5 and 6.

(3) Moisture-heat Resistance

The moisture-heat resistance was evaluated based on the adhesion and the corrosion of a metal substrate.

Using a pure PC substrate, a substrate formed by applying an aluminum coating on a PC substrate by sputtering, and a substrate formed by applying a gold coating on a PC substrate by sputtering, the composition was applied to each substrate in the same manner as in (2). The substrates were then allowed to stand at 80° C. under a relative humidity of 85% RH for 96 hours in a thermo-hygrostat. After that, water on the sample was wiped to evaluate the adhesion of the cured product to each substrate according to the same method and standard as those in the Adhesion to a substrate, section (2).

In the above aging under high temperature and high moistened conditions, when corrosion was observed on the substrate, the moisture-heat resistance based on the corrosion was determined to be low and this case was indicated by "U" in Tables 5 and 6, and when corrosion was not observed on the substrate, the oisture-heat resistance based on the corrosion was etermined to be high and this case was indicated by "S" in Tables 5 and 6.

TABLE 3

| | Example (Unit: parts by weight) | | | | | | |
|---|---|---|---|---|---|---|---|
| Component | 6 | 7 | 8 | 9 | 10 | 11 | 12 |
| A3 | 31 | — | — | 28 | — | — | 31 |
| A4 | — | 35 | — | — | 38 | 28 | — |
| A5 | — | — | 25 | — | — | — | — |
| B1 | 2 | 5 | 2 | 2 | 2 | 2 | 2 |
| C1 | 11 | 20 | 10 | — | 20 | 15 | 11 |
| C2 | 30 | 20 | 30 | — | 20 | — | 30 |
| C3 | 10 | — | 10 | 10 | — | 10 | 10 |

TABLE 3-continued

| | Example (Unit: parts by weight) | | | | | | |
|---|---|---|---|---|---|---|---|
| Component | 6 | 7 | 8 | 9 | 10 | 11 | 12 |
| C4 | 16 | — | 23 | 20 | — | — | 16 |
| C5 | — | 20 | — | — | — | — | — |
| C6 | — | — | — | 40 | — | 20 | — |
| C7 | — | — | — | — | 20 | — | — |
| D1 | 1 | 1 | 2 | — | 1 | 1 | 1 |
| D2 | — | — | — | 1 | — | — | — |
| E1 | — | — | 4 | — | — | 4 | — |
| E2 | 2 | 2 | — | 2 | 2 | — | 2 |
| E3 | 3 | — | — | — | 3 | — | 3 |
| E4 | — | 3 | — | — | — | 3 | — |
| E5 | — | — | — | 3 | — | — | — |
| E6 | — | — | 3 | — | — | — | — |
| F1 | — | — | — | — | — | 25 | — |
| F2 | — | — | — | — | — | — | 10 |

TABLE 4

| | Comparative Example (unit: part by weight) | | | | | | |
|---|---|---|---|---|---|---|---|
| Component | 3 | 4 | 5 | 6 | 7 | 8 | 9 |
| A1 | 31 | 31 | 31 | — | — | — | — |
| A2 | — | — | — | 28 | — | 30 | 35 |
| A3 | — | — | — | — | 25 | — | — |
| B1 | 2 | 2 | — | 1 | 2 | — | — |
| C1 | 16 | 16 | 16 | 15 | 23 | — | — |
| C5 | — | — | — | — | — | 35 | 20 |
| E1 | — | — | — | — | — | 1.5 | — |
| E2 | 2 | 2 | 2 | 2 | 2 | — | — |
| E3 | 3 | 3 | 3 | 3 | 3 | — | — |
| E4 | — | — | — | — | — | — | — |
| E5 | — | — | — | — | — | 1.5 | — |
| E6 | — | — | — | — | — | — | 5 |
| G1 | 1 | — | — | — | — | — | — |
| G2 | — | 2 | — | — | — | — | — |
| G3 | — | — | 1 | — | — | — | — |
| G4 | — | — | — | 2 | — | — | — |
| G5 | — | — | — | — | 1 | — | — |
| H1 | 11 | 11 | 11 | 15 | 10 | — | 45 |
| H2 | 30 | 30 | 30 | 30 | 30 | — | — |
| H3 | 10 | 10 | 10 | 10 | 10 | — | — |
| H4 | — | — | — | — | — | 35 | — |

TABLE 5

| | Example | | | | | | |
|---|---|---|---|---|---|---|---|
| | 6 | 7 | 8 | 9 | 10 | 11 | 12 |
| Viscosity (mPa-s) | 450 | 650 | 700 | 1500 | 1800 | 800 | 560 |
| Adhesion | | | | | | | |
| PC | S | S | S | S | S | S | S |
| Aluminum | S | S | S | S | S | S | S |
| Gold | S | S | S | S | S | S | S |
| Moisture-heat resistance | | | | | | | |
| Adhesion | | | | | | | |
| PC | S | S | S | S | S | S | S |
| Aluminum | S | S | S | S | S | S | S |
| Gold | S | S | S | S | S | S | S |
| Corrosion-Resistance | S | S | S | S | S | S | S |

TABLE 6

| | Comparative Example | | | | | | |
|---|---|---|---|---|---|---|---|
| | 3 | 4 | 5 | 6 | 7 | 8 | 9 |
| Viscosity (mPa·s) | 440 | 430 | 450 | 660 | 750 | 100 | 300 |
| Adhesion | | | | | | | |
| PC | S | S | S | S | S | S | U |
| Aluminum | S | S | U | S | S | U | U |
| Gold | U | U | U | U | U | U | U |
| Moisture-heat resistance | | | | | | | |
| Adhesion | | | | | | | |
| PC | S | S | S | S | S | U | U |
| Aluminum | S | S | U | S | S | U | U |
| Gold | U | U | U | U | U | U | U |
| Corrosion-Resistance | S | S | S | S | S | U | U |

EFFECTS OF THE INVENTION

The photocurable resin composition of the present invention exhibits a faster cure speed than any conventional resin compositions on exposure to radiation such as ultraviolet light, visible light, and electron beams. The cured product exhibits high adhesion to plastic substrates such as polycarbonate, metals such as aluminum or gold, or inorganic compounds such as glass. Moreover, the adhesion of the cured product is excellent in a wide temperature range and stable even under high temperature-high humidity conditions. Although the cured product exhibits water absorption of the same level as conventional products, the resulting amount of corrosion of sputtered metal is slight or none. The resin composition therefore is useful as an adhesive for optical disks, for example, particularly as an adhesive for manufacturing bonding-type optical disks such as digital-versatile-disks, in which high adhesion to plastics, metals, inorganic compounds, and the like is required.

What is claimed is:

1. An optical disk comprising an adhesive comprising, prior to cure:

A) 0.1–5 wt %, relative to the total weight of the adhesive, of (meth)acryloyl phosphate;

B) an organosilyl-containing mercapto compound;

C) a urethane (meth)acrylate oligomer;

D) a (meth)acrylate compound; and

E) a photoinitiator.

2. The disk of claim 1, wherein said adhesive, after cure, has a refractive index of about 1.50 to about 1.60 at 25° C.

3. The disk of claim 1, wherein said adhesive, after cure, has a light transmittance of greater than 90% or more.

4. The disk of claim 1, wherein a 50 μm thick layer of said adhesive is substantially cured upon exposure to UV light at a dose of from about 2 to about 50 mJ/cm².

5. The disk of claim 1, wherein said adhesive, after cure, has a glass transition temperature of between about 10 to about 500° C.

6. The disk of claim 1, wherein said adhesive, after cure, has a glass transition temperature of between about 30 to about 120° C.

7. The disk of claim 1, wherein said adhesive has a viscosity in the range of about 100–2,000 mPa.s at 25° C.

8. The disk of claim 1, wherein said adhesive, after cure, exhibits good adhesion to gold, aluminum, and polycarbonates.

9. The disk of claim 1, wherein said (meth)acryloyl phosphate comprises 2–3 (meth)acryloyl groups.

10. The disk of claim 1, wherein said (meth)acryloyl phosphate component has an acid number of less than 50.

11. The disk of claim 1, wherein said (meth)acryloyl phosphate is represented by formula (3):

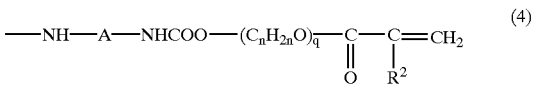

(3)

wherein $R^2$ is a hydrogen atom or methyl group;

Y represents a monovalent organic group;

q is an integer from 1–10;

n is an integer from 1–10; and r is an integer from 1–3.

12. The disk of claim 11, wherein Y is represented by formula (4);

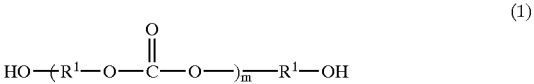

(4)

wherein

A represents a residual group excluding the two-NCO groups from a diisocyanate compound.

13. The disk of claim 1, wherein said urethane (meth)acrylate oligomer has a polyester or polycarbonate backbone.

14. The disk of claim 1, wherein said urethane (meth)acrylate oligomer is derived from a polycarbonate polyol represented by the formula (1):

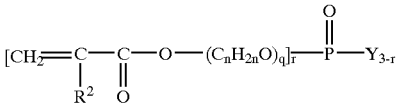

(1)

wherein each $R^1$ independently represents an alkylene group having 2–20, or a residual group, from (poly)ethylene glycol, (poly)propylene glycol, or (poly)tetramethylene glycol;

and m is an integer from 1–30.

15. The disk of claim 1, wherein said adhesive comprises, prior to cure, two (meth)acrylate compounds.

16. The disk of claim 1, wherein said organosilyl-containing mercapto compound comprises an organosilyl group represented by the formula -SiR$^a$R$^b$R$^c$, wherein R$^a$, R$^b$, and R$^c$ independently represent an alkyl group, an alkoxy group, a phenyl group, a halogen atom, or a hydrogen atom.

17. The disk of claim 1, wherein said adhesive farther comprises a hydroxy-containing compound selected from the group consisting of hydroxybutyl vinylether, hydroxyethyl vinylether, hydroxyethylacrylate, 4-hydroxybutylacrylate, pentaerythritolmonoacrylate, trimethylolpropenetriol monoacrylate, trimethylolpropane triol diacrylate, 2-hydroxy-1-phenyl-3-acrylate and alkoxylated trimethylolpropanetriol-diacrylate.

18. The optical disk of claim 1, wherein said adhesive comprises, prior to cure, 0.1–3 wt % of said (meth)acryloyl phosphate.

19. The optical disk of claim 1, wherein said adhesive comprises, prior to cure, 0.1–2 wt % of said (meth)acryloyl phosphate.

* * * * *